United States Patent [19]

Noda

[11] Patent Number: 4,571,703
[45] Date of Patent: Feb. 18, 1986

[54] STATIC SEMICONDUCTOR MEMORY DEVICE

[75] Inventor: Makoto Noda, Yokohama, Japan

[73] Assignee: Tokyo Shibaura Denki Kabushiki Kaisha, Japan

[21] Appl. No.: 497,137

[22] Filed: May 23, 1983

[30] Foreign Application Priority Data

May 31, 1982 [JP] Japan .................................. 57-92928

[51] Int. Cl.⁴ .............................................. G11C 7/00
[52] U.S. Cl. ...................................... 365/154; 365/190
[58] Field of Search ................ 365/149, 154, 190, 189

[56] References Cited

U.S. PATENT DOCUMENTS 4,447,891  5/1984  Kadota ................................ 365/154

OTHER PUBLICATIONS

Arzwbi, "Two-Device Storage Cell", IBM Tech. Disclosure Bulletin, vol. 18, No. 3, Aug. 1975, pp. 649–650.
Introduction to VLSI Systems, Chap. 5, Sec. 5.9, Register Array, p. 163; 1980.

Primary Examiner—Joseph A. Popek
Attorney, Agent, or Firm—Finnegan, Henderson, Farabow, Garrett & Dunner

[57] ABSTRACT

A static memory device includes memory cells arranged in the form of a matrix. The memory cells are each formed of a flip-flop circuit and first and second MOS transistors whose current paths are each coupled between a corresponding one of first and second bistable output nodes of the flip-flop circuit and a corresponding one of paired digit lines and whose gates are coupled to first and second word lines, respectively.

6 Claims, 4 Drawing Figures

STATIC SEMICONDUCTOR MEMORY DEVICE

BACKGROUND OF THE INVENTION

This invention relates to a static semiconductor memory device.

FIG. 1 shows an example of a memory cell used in a priot art static random access memory (RAM). This memory cell includes a first inverter 2, a second inverter 4 whose input and output terminals are coupled to the output and input terminals of the first inverter 2, respectively, and transfer gate MOS transistors 6 and 8 whose current paths are coupled between the output terminals of the first and second inverters 2 and 4 and a pair of digit lines DL1 and DL0, respectively, and whose gates are coupled in common to a word line WL.

FIG. 2 shows a static RAM including memory cells MC-11 to MC-44 which are each constructed in the same manner as the memory cell shown in FIG. 1 and are arranged in the form of a four-row, four-column matrix. Among these memory cells MC-11 to MC-44, those in the same row are coupled to a corresponding one of word lines WL1 to WL4, and those in the same column are coupled to a corresponding pair of digit lines DL1-1 and DL0-1, DL1-2 and DL0-2, DL1-3 and DL0-3, and DL1-4 and DL0-4. The word lines WL1 to WL4 are coupled to a row decoder 10.

The RAM shown in FIG. 2 is used as a register file for temporarily storing data which is supplied to, for example, an arithmetic logic unit (ALU) of a central processing unit (CPU) of a microcomputer. If two out of four words stored in the RAM are supplied as operand data to the ALU, a one-word data is first read out as a first operand data from the RAM and is stored in a buffer register of the ALU. Then, another one-word data is supplied as a second operand data to the ALU, where it is operated on along with the first operand data stored in the buffer register.

In reading out the two words as the first and second operand data from the RAM shown in FIG. 2 and supplying them to the ALU, it is necessary to execute the readout of the words during different reading periods, so that the operation speed of the CPU is restricted. Further, the RAM of this conventional type requires a buffer register for storing the first operand data, thereby complicating the construction of the ALU.

SUMMARY OF THE INVENTION

The object of this invention is to provide a semiconductor memory device capable of simultaneously reading out two word data.

The above object may be attained by providing a static semiconductor memory device which comprises a plurality of memory cells each including a flip-flop circuit and a pair of transfer gates coupled individually at one end to bistable output nodes of the flip-flop circuit, the memory cells being arranged in the form of a matrix, plural pairs of word lines, each pair being coupled individually to the control terminals of each pair of transfer gates of memory cells in the same row, and a plurality of pairs of digit lines, each pair being coupled individually to the other ends of each pair of transfer gates of memory cells in the same column, wherein data stored in each memory cell is read out through one of a selected pair of digit lines.

According to this invention, data in the memory cells on a row selected by energizing a first one of a pair of word lines are read out through first digit lines out of the pairs of digit lines, while data in the memory cells on a row selected by energizing a second one of a pair of word lines are read out through second digit lines out of the plurality of digit lines. The first and second word lines may be energized substantially simultaneously, so that data in the memory cells in the same row or in two different rows are simultaneously read out through the first and second digit lines individually. Thus, the read time may be greatly shortened.

DETAILED DESCRIPTION OF THE PREFERRED EMBODIMENT

Figure 1:
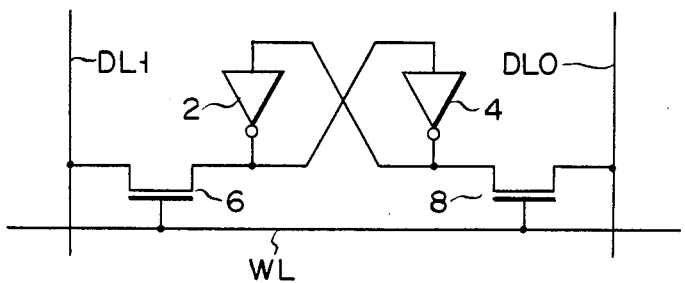
FIG. 1 shows a memory cell used in a prior art static random access memory.
Figure 2:
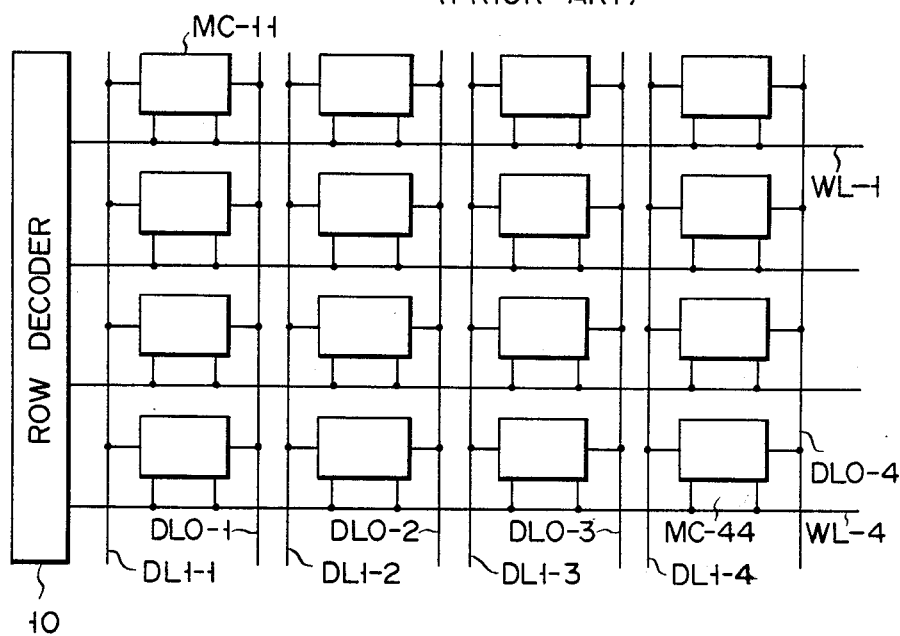
FIG. 2 shows a random access memory including a plurality of memory cells each having the same construction as the one shown in FIG. 1 and arranged in the form of a matrix.
Figure 3:
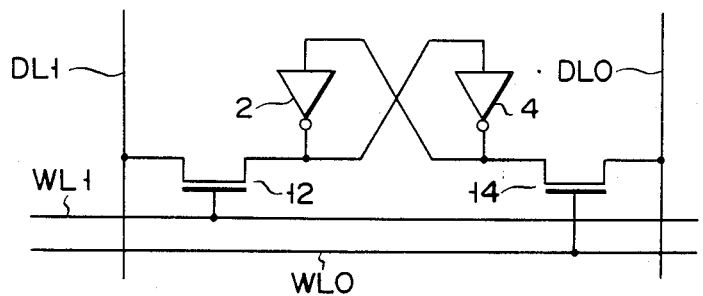
FIG. 3 shows a memory cell used in a static random access memory according to one embodiment of this invention.

FIG. 3 is a circuit diagram of a memory cell used in a static semiconductor memory device according to one embodiment of this invention. This memory cell comprises a flip-flop circuit formed of two inverters 2 and 4, just as in the memory cell shown in FIG. 1, and transfer gate MOS transistors 12 and 14 coupled at one end to bistable output nodes of the flip-flop circuit and at the other end to digit lines DL1 and DL0, respectively. As is conventionally known, the inverters 2 and 4 are each formed of, for example, a combination of load MOS transistors and drive MOS transistors or a combination of resistors and drive MOS transistors. The gates of the MOS transistors 12 and 14 are coupled to word lines WL1 and WL0, respectively.

In the reading operation of the memory cell shown in FIG. 3, if the word line WL1 is activated or energized, the data stored in the memory cell is read out through the digit line DL1. If the word line WL0 is energized, the data stored in the memory cell is read out through the digit line DL0. The word lines WL1 and WL0 can be energized simultaneously. If this is done, the data stored in the memory cell are read out through the digit lines DL1 and DL0.

In writing data in the memory cell, the word lines WL1 and WL0 are simultaneously energized with the digit lines DL1 and DL0 precharged to "1" or "0" level potential. Thus, data corresponding to the level difference of the potentials on the digit lines DL1 and DL0 is written in the memory cell.

Figure 4:
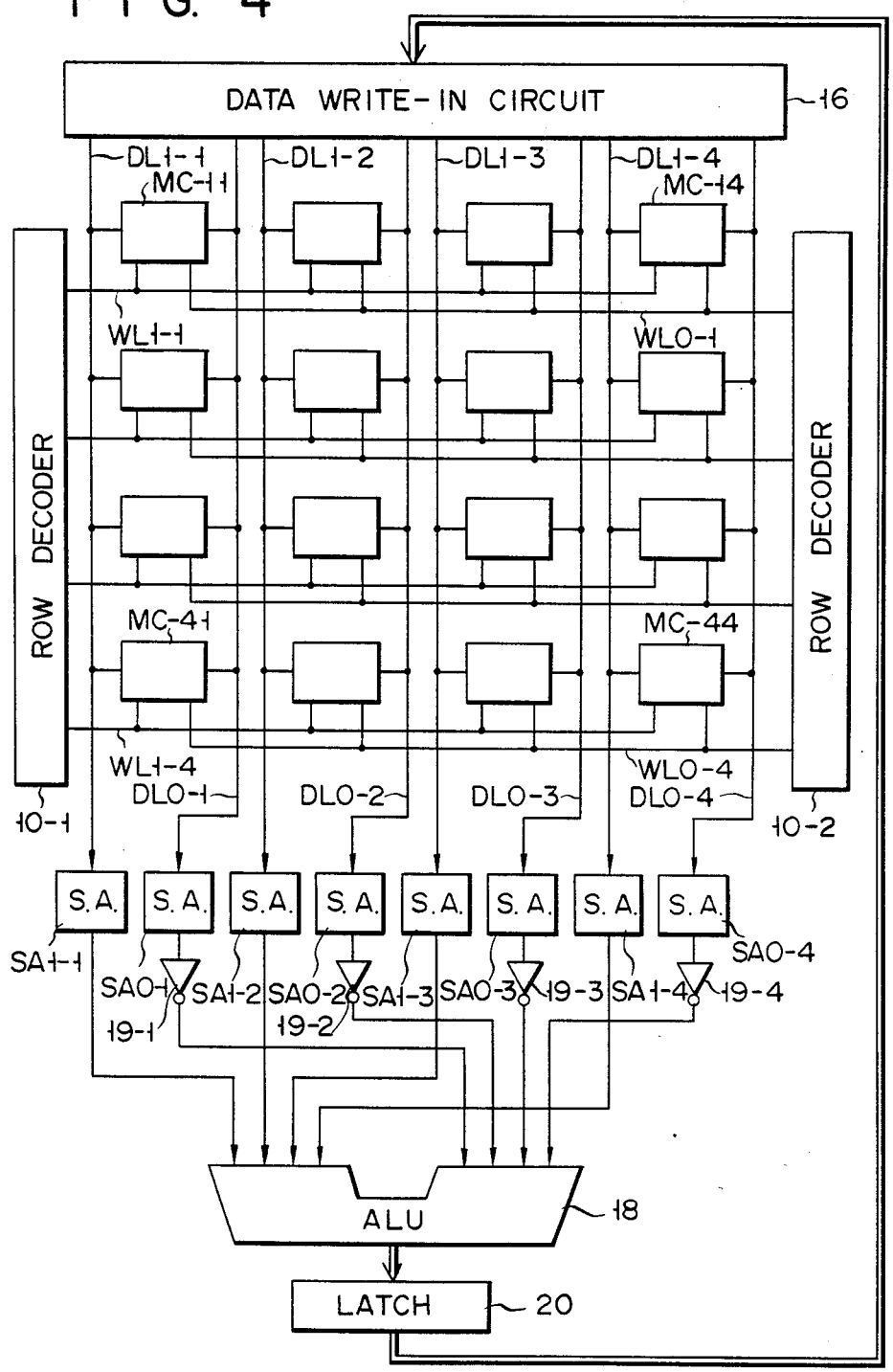
FIG. 4 shows a data processing circuit using the static random access memory according to the one embodiment of the invention.

FIG. 4 shows a static RAM provided with a data processing circuit including a plurality of memory cells MC-11 to MC-44 which are each constructed in the same manner as the memory cell shown in FIG. 3 and are arranged in the form of a four-row, four-column matrix. The gates of those transfer gate MOS transistors of memory cells in the same row among the memory cells MC-11 to MC-44, which correspond to the MOS transistor 12 of FIG. 3 are coupled in common with a corresponding one of first word lines WL1-1 to WL1-4. Likewise, the gates of those transfer gate MOS transistors of memory cells in the same row which correspond to the MOS transistor 14 of FIG. 3 are coupled with a corresponding one of second word lines WL0-1 to WL0-4. For example, the word line WL1-1 is coupled to the gates of those transfer gate MOS transistors of the memory cells MC-11 to MC-14 in the same row which each correspond to the MOS transistor 12, while the word line WL0-1 is coupled to the gates of those transfer gate MOS transistors which each correspond to the MOS transistor 14.

Further, the current paths of those transfer gate MOS transistors of memory cells in the same column, among the memory cells MC-11 to MC-44, which correspond to the MOS transistor 12 are coupled with a corresponding one of digit lines DL1-1 to DL1-4. Likewise, the current paths of those transfer gate MOS transistors which correspond to the MOS transistor 14 are coupled with a corresponding one of digit lines DL0-1 to DL0-4. For example, the digit line DL1-1 is coupled to the current paths of those transfer gate MOS transistors of the memory cells MC-11 to MC-41 in the same column which correspond to the MOS transistor 12, while the digit line DL0-1 is coupled to the current paths of those transfer gate MOS transistors which correspond to the MOS transistor 14.

The first word lines WL1-1 to WL1-4 are coupled to a first row decoder 10-1, while the second word lines WL0-1 to WL0-4 are coupled to a second row decoder 10-2. The digit lines DL1-1 to DL1-4 and DL0-1 to DL0-4 are coupled at one end to a data write-in circuit 16, and at the other end to sense amplifiers SA1-1 to SA1-4 and SA0-1 to SA0-4, respectively. The output terminals of the sense amplifiers SA1-1 to SA1-4 are coupled to a first input port of an ALU 18, while those of the sense amplifiers SA0-1 to SA0-4 are coupled to a second input port of the ALU 18 through inverters 19-1 to 19-4, respectively. The output port of the ALU 18 is coupled to the data write-in circuit 16 through a latch circuit 20.

In the reading operation, if one of the word lines WL1-1 to WL1-4 is selected by the row decoder 10-1, the data stored in the memory cells coupled to the selected word line are read out individually through the digit lines DL1-1 to DL1-4, and are supplied to the first input port of the ALU 18 through the sense amplifiers SA1-1 to SA1-4. If one of the word lines WL0-1 to WL0-4 is selected by the row decoder 10-2, the data stored in the memory cells coupled to the selected word line are read out individually through the digit lines DL0-1 to DL0-4, and are supplied to the second input port of the ALU 18 through the sense amplifiers SA0-1 to SA0-4.

There will now be described the operation of the data processing circuit shown in FIG. 4.

Suppose now that an Add-Register-to-Register instruction is executed whereby four-bit data or one-word data stored in the memory cells MC-11 to MC-14 and one-word data stored in the memory cells MC-41 to MC-44 are added and the result of addition is written in the memory cells MC-11 to MC-14. In this case, the row decoders 10-1 and 10-2 are first supplied, respectively, with row address signals to designate the first and fourth rows from a row address designation circuit (not shown). As a result, the word lines WL1-1 and WL0-4 are energized, so that 4-bit data from the memory cells MC-11 to MC-14 in the first row is read out onto the digit lines DL1-1 to DL1-4, and 4-bit data from the memory cells MC-41 to MC-44 on the fourth row is read out onto the digit lines DL0-1 to DL0-4.

The bit data on the digit lines DL1-1 to DL1-4 are sensed and amplified by the sense amplifiers SA1-1 to SA1-4, respectively, and then supplied to the first input port of the ALU 18. The bit data on the digit lines DL0-1 to DL0-4 are sensed and amplified by the sense amplifiers SA0-1 to SA0-4, respectively, inverted by the inverters 19-1 to 19-4, respectively, and then supplied to the second input port of the ALU 18. The ALU 18 adds the first and second operand data received at the first and second input ports, and supplies the result of addition to the latch circuit 20.

Subsequently, the data write-in circuit 16 produces 4-bit data corresponding to the one-word data latched in the latch circuit 20, in response to a write command signal from an operation mode setting circuit (not shown). In this case, the potential levels of the digit lines DL1-1 to DL1-4 are set different from those of the digit lines DL0-1 to DL0-4. At this time, address signals for designating the first row are supplied from the row address designation circuit (not shown) to the row decoders 10-1 and 10-2. As a result, each pair of transfer gate MOS transistors of the memory cells MC-11 to MC-14 is turned on so that each of four bit data corresponding to the level difference of paired bit signals which is in an inverted relationship and are supplied from the data write-in circuit 16 through a corresponding pair of digit lines is written in a corresponding one of the memory cells MC-11 to MC-14.

Although an illustrative embodiment of this invention has been described in detail herein, the invention is not limited to that precise embodiment.

In the embodiment described above, the memory cells are arranged in the form of a four-row, four-column matrix. However, the numbers of rows and columns may be changed as required.

What is claimed is:

1. A static semiconductor memory device capable of read-out and write-in operations comprising:

a plurality of memory cells each including a flip-flop circuit having first and second bistable output nodes and a pair of transfer gates each coupled at one end to the respective first and second bistable output nodes of the flip-flop circuit;

plural pairs of digit lines, each pair being respectively coupled to the other ends of said pair of transfer gates of each of memory cells that are in the same column of said plurality of memory cells, and each pair of digit lines being used for both read-out and write-in operations for said memory device;

a plurality of first word lines each coupled to one of said pair of transfer gates in each of said memory cells that are in the same row of said plurality of memory cells;

a plurality of second word lines each coupled to the other of said pair of transfer gates in each of said memory cells that are in the same row of said plurality of memory cells;

a first row selection circuit coupled to said plurality of first word lines for selecting said first word lines for both read-out and write-in operations for said memory device;

a second row selection circuit coupled to said plurality of second word lines for selecting said second word lines for both read-out and write-in operations for said memory device; and means, coupled to said plural pairs of digit lines, for energizing said pairs of digit lines during write-in operations and for sensing said pairs of digit lines during read-out operations, whereby read-out operations are effected with at least one of said first and second word lines in the same row of memory cells and write-in operations are effected with said first and second word lines in the same row of memory cells.

2. A static semiconductor memory device according to claim 1, wherein said pair of transfer gates of each said memory cell is formed of two MOS transistors whose gates are each coupled to a different one of said first and second word lines, respectively.

3. A static semiconductor device according to claim 2, wherein said flip-flop circuit is formed of a first inverter and a second inverter whose input and output terminals are coupled to the output and input terminals of the first inverter, respectively.

4. A static semiconductor memory device according to claim 1, wherein said flip-flop circuit is formed of a first inverter and a second inverter whose input and output terminals are coupled to the output and input terminals of the first inverter, respectively.

5. A static memory cell coupled to a pair of digit lines providing data for write-in to said cell and for receiving data for read-out from said cell and also coupled to a pair of word lines to select said cell for both read-out and write-in from said cell, said cell comprising:

a flip-flop circuit having first and second biastable output nodes; and first and second MOS transistors whose current paths are coupled at one end to the first and second bistable output nodes, respectively, and coupled at another end to different ones of said pair of digit lines, providing data for write-in to said cell and receiving data for read-out from said cell, and whose gates are each coupled to a different one of said word lines.

6. A static memory cell according to claim 5, wherein said flip-flop circuit is formed of a first inverter and a second inverter whose input and output terminals are coupled to the output and input terminals of the first inverter, respectively.

* * * * *